United States Patent [19]

Lemelson

[11] Patent Number: 4,874,596

[45] Date of Patent: Oct. 17, 1989

[54] PRODUCTION OF CRYSTALLINE STRUCTURES

[76] Inventor: Jerome H. Lemelson, 85 Rector St., Metuchen, N.J. 08840

[21] Appl. No.: 625,197

[22] Filed: Jun. 28, 1984

Related U.S. Application Data

[63] Continuation of Ser. No. 302,644, Sep. 15, 1981, abandoned, which is a continuation-in-part of Ser. No. 110,477, Jan. 8, 1980, abandoned, which is a continuation of Ser. No. 815,692, Jul. 14, 1977, abandoned, which is a continuation of Ser. No. 547,733, Feb. 6, 1975, which is a continuation-in-part of Ser. No. 93,779, Nov. 30, 1970, Pat. No. 4,207,154, said Ser. No. 302,644, is a continuation-in-part of Ser. No. 74,388, Sep. 10, 1979, Pat. No. 4,385,880, Ser. No. 958,514, Nov. 7, 1978, abandoned, and Ser. No. 165,445, Jul. 26, 1971, which is a continuation of Ser. No. 710,517, Mar. 5, 1970, which is a continuation of Ser. No. 501,695, Oct. 22, 1965.

[51] Int. Cl.$^4$ ............................ B01J 3/06; G21B 1/00
[52] U.S. Cl. .................................... 423/446; 376/103; 376/146; 376/152; 423/659; 423/DIG. 11; 219/121.85; 204/157.15
[58] Field of Search ............... 376/101, 103, 105, 146, 376/152; 219/121 L, 121 LM; 204/157.15; 423/446, 659, DIG. 11

[56] References Cited

U.S. PATENT DOCUMENTS

| | | | |
|---|---|---|---|
| 2,793,282 | 5/1957 | Steigerwald | 219/121.1 L |
| 2,861,166 | 11/1958 | Cargill, Jr. | 219/121 LM |
| 2,968,723 | 1/1961 | Steigerwald | . |
| 3,207,582 | 9/1965 | Inoue | 423/446 |
| 3,346,458 | 10/1967 | Schmidt | 176/1 |
| 3,378,446 | 4/1968 | Whittlesey | 176/1 |
| 3,489,645 | 1/1970 | Darber et al. | 176/1 |
| 3,702,573 | 11/1972 | Nemeth | 423/446 X |
| 3,714,332 | 1/1973 | Rasquin et al. | 423/446 |
| 3,967,215 | 6/1976 | Bellak | 176/9 |
| 4,161,436 | 7/1979 | Gould | . |
| 4,228,142 | 10/1980 | Holcombe, Jr. et al. | 423/446 X |

FOREIGN PATENT DOCUMENTS

| | | | |
|---|---|---|---|
| 1061592 | 4/1954 | France | . |
| 1240668 | 8/1960 | France | 176/1 |
| 7244438 | 11/1972 | Japan | 423/446 |
| 106513 | 7/1982 | Japan | 423/446 |
| 195094 | 10/1985 | Japan | 423/446 |
| 774052 | 5/1957 | United Kingdom | 176/1 |
| 825026 | 12/1959 | United Kingdom | 176/1 |
| 841387 | 7/1960 | United Kingdom | 176/1 |
| 1482526 | 8/1977 | United Kingdom | 376/101 |

OTHER PUBLICATIONS

Physics Today, Aug. 1973, pp. 46–53, Nuckolls et al., "Laser Induced Thermonuclear Fusion".
Trans. of the A.N.S., 6/77, pp. 12–15.

Primary Examiner—John S. Maples

[57] ABSTRACT

An apparatus and method for reacting on material by means of intense radiation employed to change the physical and, in certain instances, the chemical characteristics of such material. In one form, an intense radiation beam is directed into a cavity of a die or support for a small quantity of material to be reacted on and the intense heat of the beam as well as the shock wave generated in the material in the die cavity by the rapid heat of the beam react on such material to change its physical characteristics. In another form, two or more intense radiation beams, such as generated by one or more lasers or electron guns as intense pulses of radiation, are directed against a particle or pellet of material directed along a predetermined path into a reaction chamber, intensely heat and transmit shock wave energy thereto from opposite directions which shock waves collapse against the material transforming it into another form. In still another form of the invention, pellets or small containers of material to be reacted on are supported by filaments, rods or other structures disposed in a reaction chamber and are reacted on by one or more intense radiation beams. In yet another form, one or more intense pulses of radiation are directed against a solid member compressing a quantity of material in a die and generate one or more shock waves in such solid member which are transmitted therethrough to the compressed material. The pellet or particles may comprise carbon which is converted to diamond by the intense heat and force of the shock wave or shock waves or other material including such other material mixed with carbon.

18 Claims, 1 Drawing Sheet

PRODUCTION OF CRYSTALLINE STRUCTURES

This application is a continuation of application Ser. No. 302,644 filed Sept. 15, 1981 abandoned; which was a CIP of Ser. No. 110,477, filed 1/8/1980 abandoned; which was a Cont. of Ser. No. 815,692, filed 7/14/1977 abandoned; which was a Cont. of Ser. No. 547,733 filed 2/6/75; which was a CIP of Ser. No. 93,779, filed 11/30/70 now U.S. Pat. No. 4,207,154; and Ser. No. 302,644, is also a CIP of Ser. No. 74,388 filed 9/10/79 now U.S. Pat. No. 4,385,880; a CIP of Ser. No. 958,514 filed 11/7/78, abandoned, and is also a continuation-in-part of Ser. No. 165,445, filed July 26, 1971, which is a continuation of Ser. No. 710,517 filed March 5, 1970, which is a continuation of Ser. No. 501,695 filed October 22, 1965.

SUMMARY OF THE INVENTION

This invention relates to an apparatus and method for reacting on material to change its physical and/or chemical characteristics, by means of one or more intense radiation beams directed at such material. In a particular form of the invention, a small quantity of carbon is converted to one or more forms thereof including diamond by the intense heat and shock wave force generated and transmitted through the material by intense radiation applied thereto. Such radiation may be applied as a short pulse of laser or electron beam radiation or a combination of such radiation applied to the material while it is disposed in a cavity of a die or other member. In another form, a plurality of beams of intense radiation are directed at a small quantity, such as a particle or pellet of matter such as carbon, which is propelled through a reaction zone or is allowed to fall therethrough by gravity.

It is known in the art to modify or change the physical and chemical characteristics of matter by subjecting such matter to high temperatures and pressures. For example, diamond may be produced from carbon by subjecting a small quantity of such carbon to extremely high pressures and temperatures for an extended period of time. It is also known to produce diamond from carbon by compressing a quantity of powdered carbon in a die by means of a piston and applying a shock wave through such piston wherein the extreme heat and force of the shock wave is transmitted to the carbon to change its physical characteristics and to convert a small portion thereof into diamond.

The instant invention involves the conversion of solid material, such as carbon, into a modified form thereof, such as diamond, by subjecting such material to the intense heat and force of an intense radiation beam or plurality of such beams generated by one or more lasers or electron guns. A variety of new materials are possible utilizing the instant invention wherein a quantity of such material is either disposed against a solid member, preferably within a restraining cavity thereof or is propelled or otherwise caused to travel a free path through space, preferably in a chamber containing a gas or void of gaseous material, and when such small quantity of material has reached a predetermined location within a reaction zone, one or more beams of intense radiation are generated and directed thereat, preferably from a plurality of directions to permit the small quantity of matter to be compressed by respective oppositely directed shock waves and intensely heated thereby to provide a new physical form, new compound or new element resulting from the intense heat and pressure of the shock wave or shock waves. As a result, a desired change in the structure and/or composition of the matter is effected without the necessity of sustaining extreme heat and pressure against the matter as required of prior art processes.

Accordingly it is a primary object of this invention to provide a new and improved apparatus and method for reacting on material to change its structure.

Another object is to provide an apparatus and method for reacting on matter to change its physical characteristics.

Another object is to provide an apparatus and method for changing the characteristics or structure of matter by means of intense radiation.

Another object is to provide an apparatus and method for changing the physical and chemical characteristics of matter by means of intense pulsed radiation.

Another object is to provide an apparatus and method for converting carbon to diamond by means of intense pulsed radiation.

Another object is to provide an apparatus and method for forming a composite article, the major portion of which is a first material while a minor portion thereof is such first material converted to a second form of the material by subjecting same to one or more pulses of intense radiation such as a beam or beams of radiation generated by one or more lasers or electron guns.

Another object is to provide new and improved structures in articles of manufacture by means of intense pulsed radiation.

Another object is to provide a new and improved cutting tool, the base of which is one material while the cutting portion or edge thereof is diamond formed from carbon or a carbon containing compound, by means of intense radiation.

Another object is to provide an apparatus and method for producing new and improved composite materials which form portions of other materials by subjecting such portions to the intense radiation of a pulsed electron beam or laser.

Another object is to provide an apparatus and method for reacting on small quantities of matter using an open die or a die closed by a transparent window and one or more intense radiation beams directed through the die at matter compressed therein.

Another object is to provide an apparatus and method for forming diamonds from pellets of carbon by intersecting such pellets from a plurality of directions simultaneously with intense laser generated beams of light energy.

Another object is to provide an improved material in the form of a composite pellet of a thermonuclear fusion material surrounding a core of carbon or other material to be reacted on when the surrounding sheel is caused to partake in a fusion reaction.

Another object is to provide apparatus and method for producing diamonds by means of thermonuclear fusion and its effect on carbon.

With the above and such other objects in view as may hereafter more fully appear, the invention consists of the novel constructions, combinations arrangements of apparatus parts and methods of their operation as will be more fully described and illustrated in the accompanying drawings, but it is to be understood that changes, variations and modifications may be resorted to which fall within the scope of the invention as claimed.

Figure 1:
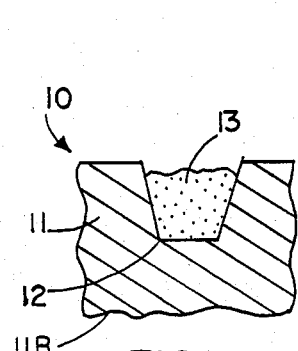
FIG. 1 is a side cross sectional view of a portion of a die containing a predetermined amount of particles of a material such as carbon, to undergo a reaction in the die.

The instant invention employs intense radiation in the form of one or more beams or a split beam of intense light such as generated by a laser or one or more electron beams generated by a plurality of electron guns, which radiation is made to intersect either a small quantity of a solid material such as carbon or other material, or a die containing such material in a manner to intensely heat same in such a short period of time as to generate one or more shock waves in such material or die and direct same through the material supported in the cavity of the die to change the physical and, in certain instances, the chemical composition of such material. Certain features of the instant invention not found in the drawings which may or may not be described hereafter, such as apparatus for handling the reaction material or materials, die handling apparatus and the like, may be found my my copending applications described and listed herein under Related Applications and reliance thereon is made for practicing the various embodiments of the invention which are not completely illustrated in the drawings and/or described herein. Where one or more lasers or electron guns are employed to generate high enough intensity radiation beams to perform the material reactions and transformations described, conventional high powered lasers or electron guns or necessary modifications thereof may be employed. Exact configurations of dies, die cavities and other devices or components comprising the instant invention will depend on reaction material(s) being used, the quantities thereof employed in each cycle and the intensity of the radiation beam or beams employed in the reaction.

In FIG. 1 is shown a portion of an apparatus or assembly 10 including a die 11 made of metal or other suitable material and defining a die base portion 11B containing one or more tapered cavities 12 formed in a surface 13 thereof. Cavity 12 is open at the surface and disposed therein is a predetermined quantity of particulate material 13 fed thereto by any suitable means and may completely or partially fill the cavity when it is fed thereto.

Figure 2:
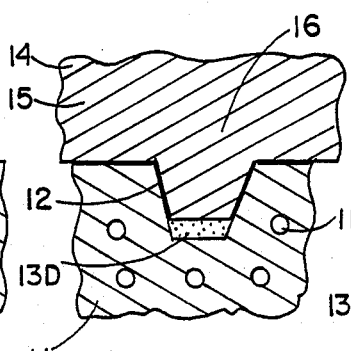
FIG. 2 is a side cross section view of a modified form of the die of FIG. 1 with the particles under compression therein by means of a protruding portion of a second die member which is in forced engagement with the die member containing the particles so as to form a high density pellet of the particles.

In FIG. 2, a second die member 14 is shown brought into assembly with the die member 11 and contains a base portion 15 with a tapered nose or protrusion 16 which extends into the cavity 12 in die member 11 and is used to compress the particulate material 13 to a densified mass 13D within the cavity 12.

Figure 3:
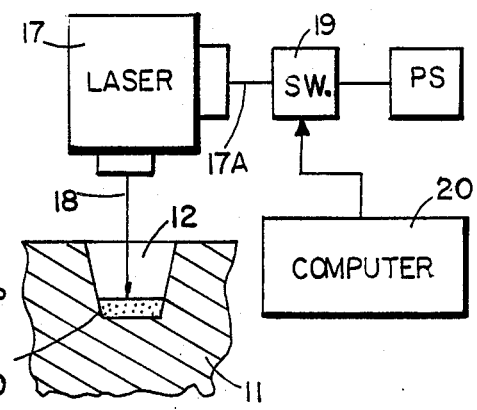
FIG. 3 is a side cross sectional view of the die of FIG. 1 containing the pellet of compressed particles, and a laser directing its intense pulse of radiation into the open die and intersecting the pellet.

In FIG. 3, the die member 14 has been removed from the location illustrated in FIG. 2 exposing the cavity 12 and densified mass of material 13D to a radiation beam 18 generated by a laser or electron gun 17 as a pulse of such radiation when a control 20, such as a computer or programmer, generates an output signal causing the switch 19 to suddenly close and allowing electrical energy to be suddenly transmitted to or discharged through the operating input 17A of the laser or electron gun 17 thereby causing the latter to generate an intense pulse of radiation 18 which is directed against the mass 13D and, in so doing, rapidly heats and creates a shock wave in the compressed material 13D.

If the material 13 comprises particles of suitable carbon material and the intensity and duration of the pulse of radiation 18 is great enough, the heat and shock wave generated and transmitted through the densified material 13D will be sufficient to create one or more diamonds thereof. If materials other than carbon or a mixture of carbon particles with particles of other elements or compounds, are employed to partially fill the cavity 12, material other than diamond or composite materials including diamonds may be formed as described by subjecting the compressed mass thereof to such intense pulse or pulses of radiation directed into the cavity and against such compressed mass.

The apparatus illustrated in FIGS. 1-3 preferably includes a suitable support for die 11 or a plurality of such dies and automatically controlled means for relatively bringing die members 11 and 14 together as shown in FIG. 2 and retracting and removing member 14 from die 11 or the latter from the former and locating die 11 or a support for the laser 17 in alignment with each other to permit the beam 18 of the laser to enter the cavity 12. Such machine components may be made in accordance with teachings found in my copending U.S. patent application Ser. No. 110,477 filed January 8, 1980 now abandoned.

The apparatus illustrated in FIGS. 1-3 may also include a die containing a plurality of cavities 12 machined or otherwise formed in one or more surfaces thereof which may be fabricated of suitable material adapted to resist destruction or damage caused by the shock waves and temperature transmitted thereto as the machine operates and the radiation beam pass into the cavity during each cycle. Die or dies 11 may thus be supported by a suitable base such as a structural metal member defining a drum, rotary table or support, belt or flight of a belt conveyor, lineally operable device or the like. Suitable means, such as one of the types described or illustrated in said patent application Ser. No. 110,477 may be provided for automatically filling the cavity 12 with particulate material to be processed and removing the processed material therefrom after it has been converted to diamond or other material by means of the heat and temperature generated when the intense radiation beam pulse or pulses intersect same as described.

Figure 4:
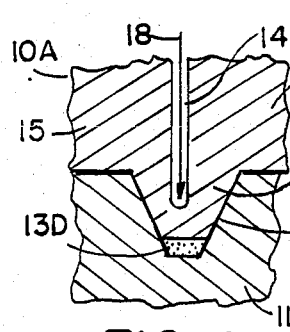
FIG. 4 is a side cross sectional view of an assembly of die elements of the type illustrated in FIG. 2, wherein a passageway extends through one of the die elements to the protruding portion thereof through which passageway an intense radiation beam is directed.

In an alternate form of the invention, one or more intense pulses of radiation may be directed against a select portion of the die 11 and/or die 14, preferably in alignment with or against the tapered portion 16 thereof when the latter is compressively engaging the densified particulate material 13D in the cavity 12. A pulse of such intense radiation directed against, for example, the bottom surface of a cavity extending through the base 15 of the die 14 from an opening at the upper end thereof as illustrated in FIG. 4, and generated by a laser or electron gun supported by or above the die 14, may be utilized, if generated at sufficient intensity, to generate a shock wave in the material of the die, which shock wave will be transmitted along the tapered portion 16 to the densified material 13D compressed by the tapered portion 16 in the cavity 12 and the shock wave may be employed to effect a predetermined change in the material 13, such as by converting all or a portion of such material to diamond or other material or composite. Depending on the shape of the tapered portion 16 of the die, the shock wave generated when the pulse of radiation intersects the bottom wall of the bore or passageway 14P extending through the die 14 may be amplified as it reflects off the walls of the tapered portion 16 and may thus be substantially intensified by the time it reaches the bottom surface of the tapered portion 16 and is transmitted therefrom to the densified material 13D. Conversely, one or more bores or passageways extending through the die 11 may also be utilized to receive and transmit one or more pulses of intense radiation therethrough to the material of the die 11 in the immediate vicinity of the cavity 12 for generating one or more intense shock waves in the die 11 which are transmitted to the densified material 13D therein, with or without such materials being engaged and compressed by the tapered portion 16 of die 14. In the latter described machine configuration and operation, the shock wave applied to the material of die 11 may be utilized to both physically change such material and expel the material from the die cavity 12.

In FIG. 4, a die assembly 10A includes a first die member 11 with a tapered cavity 12 formed in a surface thereof and containing a quantity of reaction material 13D compressed by a protruding portion 16 of a second die 14 which is in forced engagement with die 11 as illustrated. The base 15 of die 14 contains an elongated passageway 14P, such as a hole drilled therein from an upper surface (not shown) of the die member 14 above which upper surface is disposed an electron gun or laser similar to the laser 17 of FIG. 3 which directs its intense pulsed radiation beam 18 through the hole or passageway 14P to the bottom row thereof which extends into the protruding portion 16 of die 14. If the beam 18 is generated at sufficient intensity, it will impart a shock wave to the die 14 in the vicinity of the surface which it intersects and such shock wave will travel along the protruding portion 16 to the end thereof and therefrom to and through the compressed pellet 13D of reaction material. If such reaction material comprises a pellet of carbon or graphite, and the shock wave generated and transmitted thereto through the solid die protruding portion 16 is of sufficient intensity, at least a portion, if not all of such carbon material may be converted to diamond in the confined space between the dies. It is noted that the material 13D has been greatly compacted and compressed to a highly densified state, as described, between the die members 14 and 11 and is maintained in such compressed condition therebetween during the period one or more shock waves are transmitted thereto through the protruding portion 16.

Figure 5:
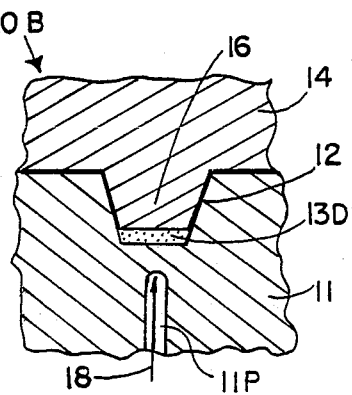
FIG. 5 is a side cross sectional view of another assembly of die elements wherein a cavity containing die element has a passageway formed therein through which an intense radiant energy beam is passed to heat and generate a shock wave in the die for reacting on matter in the cavity of the die.

In FIG. 5, an assembly 10B of die members of the type described and denoted 11 and 14, is provided, wherein the die member 11 contains an elongated passageway or bore 11P extending from a bottom surface thereof (not shown) through which passageway an intense radiation beam is directed to the end wall thereof, which is disposed in direct alignment with the bottom wall of the cavity 12 of the die member 11. A compressed pellet or disc 13D of reaction material, such as carbon, is compressed between the protruding portion 16 of die member 14 and the bottom wall of the cavity 12, as illustrated, and receives one or more intense shock waves generated when the intense pulse of beam radiation 18 intersects the end wall of the passageway 11P, so as to provide intense heat within and force against the compressed material 13D of sufficient intensity to change such material to another form, such as diamond.

Figure 6:
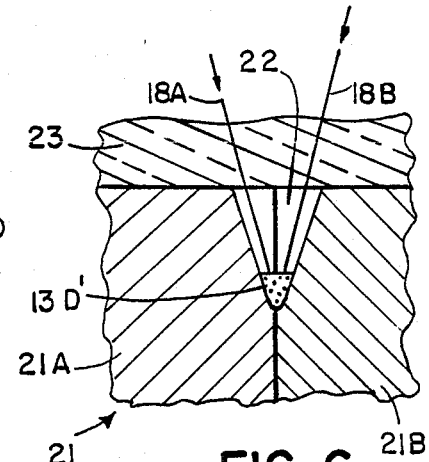
FIG. 6 is a side cross sectional view of another assembly of die elements containing a cavity in which a pellet of material is reacted on by radiation which die elements may be split open or separated to open the cavity and facilitate removal of material, which has been reacted on, therefrom.

In FIG. 6, an assembly 21 of two female die members 21A and 21B is provided, which die members are separable from each other, permitting a small quantity 13D' to be removed from between the split die members after having been reacted on by intense radiation of the type described. Also illustrated in FIG. 6 is a cover or window 22, preferably made of high temperature glass or ceramic material, which is disposed across the tapered cavity 21 formed between the two female die members 21A and 21B and is preferably in compressive engagement with the upper surfaces of such die members so as to seal the cavity during the reaction phase of the cycle. Two intense radiation beams 18A and 18B are illustrated as directed at an angle to each other through the window 23 into the tapered conical cavity 22 for simultaneously reacting on the small quantity of reaction material disposed in the bottom of such cavity and forming, for example, diamond or other material thereof in the manner described above. Additional radiation beams may also be directed into the cavity in a symmetrical array and focused within or against the upper surface of the pellet 13D' of reaction material to intensely heat and generate a shock wave or waves therein to effect the formation of diamond or other crystalline or non-crystalline material thereof.

It is noted that a high temperature glass or ceramic material may also form part of a male die member such as member 14 of FIGS. 2 and 5 or define the entire member, 23 through which window intense beam or focused beam radiation of the type described may be directed against the compressed pellet of reaction material or carbon disposed between the dies in the assemblies illustrated, rather than directing the laser beam through an open die cavity as illustrated in FIG. 3.

Figure 7:
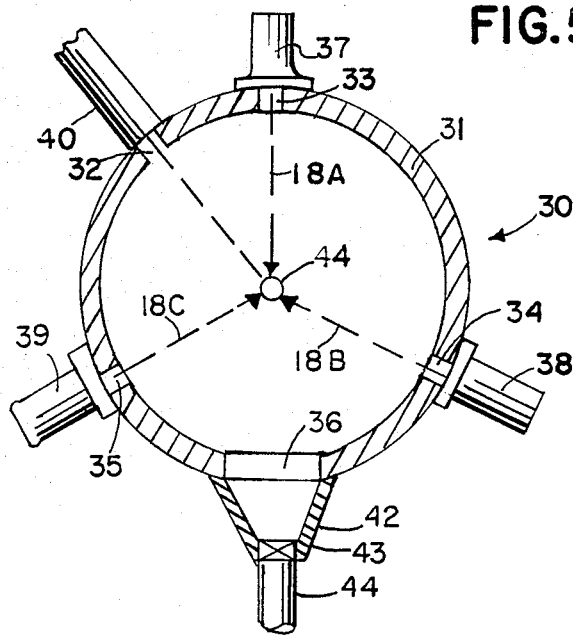
FIG. 7 is a side cross sectional view of a reaction chamber of spherical shape in which intense radiation beam effected reactions may be effected with respect to particles or pellets of material such as carbon or other material.

As mentioned above, diamonds and other highly densified materials may be formed of pellets thereof which are directed into a reaction chamber from a supply thereof and, upon reaching a selected location within such chamber, may be intersected by two or more intense radiation beams, preferably although not necessarily simultaneously intersecting a single pellet at the center of the reaction chamber and operable to intensely heat and convert the pellet material to another form, such as diamond. In FIG. 7, such a reaction apparatus 30 is provided which includes a spherical reaction chamber 31, made of stainless steel or other suitable material and having secured to the outer surface of the spherical wall thereof, a plurality of devices including a plurality of lasers, three of which are shown in FIG. 7 and are denoted 37, 38 and 39. Openings or windows 33, 34 and 35 in the wall of the spherical chamber 31 permit intense beam radiation generated by the lasers 37, 38 and 39 to pass therefrom into the reaction chamber. If the lasers are properly aligned, their radiation beams 18A, 18B and 18C may be directed along axes such that they will intersect at a predetermined location, such as the center of the spherical volume defined by the spherical chamber 31, and one or more particles or pellets of reaction material, such as carbon, may be supported within or directed to such central portion of the chamber to be simultaneously intersected and reacted on by the plurality of laser beams so as to impart extremely high temperature and the force of the shock waves generated in the pellet or particle by the beams which simultaneously intersect same. If the intense beams of radiation are pulsed and properly directed, each may generate its own shock wave within the pellet, which shock waves converge towards each other intensely compressing and heating the material of the pellet and such intense heat and force may be employed to form one or more diamonds of the material of the pellet.

Notation 40 refers to an elongated chamber disposed across and sealing an opening 32 in the wall of the spherical chamber 31. Located within chamber 40 is a supply of pellets or particles 44 of material to be reacted on and means, such as an electro-mechanical mechanism driven by a motor and operable for mechanically directing pellets, one at a time, into the chamber from the end of housing 40 or releasing a high velocity presurized gas as a stream for carrying one or more pellets thereon into chamber 31 to the central location thereof defining the intersection of the axes of the beams of the lasers 37, 38 and 39.

The operation of the apparatus of FIG. 7 may be effected under the control of a master controller or computer wherein precise timing is employed to control the ejection of the pellet into the chamber and the simultaneous generation of the pulses of intense beam radiation by the lasers 37, 38 and 39. It is also noted that a single laser may be employed with the intense beam thereof split into three or more separate beams by suitable mirrors and other optical devices and directed by such devices through respective windows or openings in the chamber 31 to the described focal location thereof when the reaction material or pellet has reached such location. A feedback control system, of the type described in my application Ser. No. 110,477, filed January 1, 1980, now abandoned, entitled, "Reaction Apparatus and Method," may be utilized in FIG. 7 and employing a photoelectric detector for detecting the pellet 44 when it reaches the focal location within the reaction chamber, which detector generates a control signal which controls the operation of the one or more lasers or electron guns directed their intense beam energy into the reaction chamber.

Also illustrated in FIG. 7 is an opening 36 in the bottom portion of the wall of the spherical reaction chamber 31 through which opening may fall material which has been reacted on by the intense radiation beams and may be collected in a tapered hopper 42 which is sealed to the wall of the chamber across the opening and fed therefrom, either individually or collectively, through a valve 43 to an exit duct or pipe 44.

Figure 8:
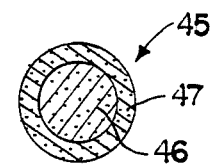
FIG. 8 is a side cross sectional view of a pellet of material to be reacted on in a reaction chamber of the type shown in FIG. 7 or a modified form thereof.

In FIG. 8 is shown a modified form of pellet for use in a reaction chamber of the type illustrated in FIG. 7 or a modified form thereof. The pellet 45 includes a core portion 46 of reaction material, such as carbon or other material to be converted by high temperature and shock waves, to diamond or other material. Completely surrounding and forming a shell on the outside surface of the spherical pellet 46 is a coating of frozen tritium-deuterium which is capable of partaking in a thermonuclear fusion reaction when intersected from a plurality of directions by a plurality of intense laser beams. The resulting fusion reaction generates intense heat and pressure which is applied to the core material 46 and is operable to transform or change such material to another form, such as diamond or diamonds. A plurality of pellets 45 of the type illustrated in FIG. 8 may be individually fed in sequence to a reaction chamber of the type shown in FIG. 7 and each simultaneously intersected by a plurality of intense pulsed radiation beams for effecting thermonuclear fusion of the fusion material 47 surrounding the core 46 of the composite pellet.

Depending on the reaction material employed, the intensity of the radiation beam or beam employed and the physical change(s) desired in the material(s) reacted on, the quantity of the carbon or other reaction material employed in pellet or particle form charged into the die may vary from an order of a few miligrams to one or more grams thereof and the shell of thermonuclear fusion material, such as frozen trittium-deuterium, may also vary from milligram to gram quantities. The described reaction may take place in a die cavity or plural die cavities or in the reaction chamber in a vacuum or predetermined atmosphere such as a vapor or gaseous atmosphere, which may or may not partake in the reaction at atmospheric or high ambient pressure.

Additional variations in the machinery described above include the following:

1. Control 20 for the laser or electron beam 17 may comprise a computer or programming device which is also operable to control apparatus for filling cavity or cavities 12 of the die 11 with particulate material to be processed, relative movement between dies 11 and 14 and an apparatus for removing processed material from one or more cavities 12 formed in die 11 or a plurality of such dies supported by a common base.

2. Particles of material to be combined with the material in the die 12 may be introduced into the cavity or beam 18 as it is directed into the cavity and implanted, welded or otherwise combined with the material in the cavity by means of the heat and shock wave force applied thereto.

3. If the die 14 is replaced by a machine component or other article, the densified material 13D may not only be physically changed in structure but may also be bonded or welded to the surface of die portion 16 which engages same, by means of the intense heat generated when the intense radiation beam is directed through the passageway 14P extending to the vicinity of the die portion 16 illustrated, for example, in FIG. 4. Cutting tools, dies and other composite devices may be fabricated by such means. It is also noted that the material in the die may be welded to the base of the cavity 12 and retained therein by the means illustrated in FIG. 3. Such retention may be such as to provide a composite article, such as a die or other device formed of the processed material and at least a portion of the die 11 or may be retained only for further processing in the die cavity after which it is removed. In the embodiment in which the material is welded to the end of protruding die portion 16, such welding may be utilized only to remove the material from the cavity when the die 14 is separated from die 11 whereafter the material may be removed from the end of die portion 16 or retained thereon for further processing.

I claim:

1. A method of changing the structure of a solid material comprising:
    disposing a quantity of a first reaction material in a solid state, which first material has a first crystalline structure, at a first location in a reaction chamber, and
    generating and directing at least one collimated high energy radiant energy beam along an axis which intersects said first location within said reaction chamber and is directed against said reaction material disposed at said first location; causing said high energy radiant energy beam to transfer a substantial portion of its radiant energy to said reaction material and to generate a shock wave in said reaction material wherein the energy transferred to said reaction material includes the energy of said shock wave which reacts on and heats said reaction material and converts at least a portion thereof from said first crystalline state to a second state having a crystalline structure which is substantially different from said first crystalline structure of said reaction material.

2. A method in accordance with claim 1 wherein said reaction material comprises a small quantity of carbon and the intensity of the radiant energy beam directed thereagainst is sufficient to convert at least a portion of said carbon to a diamond-like crystalline structure.

3. A method in accordance with claim 1 wherein said reaction material is in the form of a solid pellet, and said step of disposing said reaction material at a first location in said reaction chamber comprises injecting said pellet into said reaction chamber along a substantially predetermined path which intersects said first location.

4. A method in accordance with claim 1 which includes simultaneously generating and directing a plurality of intense radiation beams along axes which intersect said first location within said reaction chamber when said reaction material is disposed at said first location.

5. A method in accordance with claim 4 wherein said step of disposing said reaction material at a first location in said reaction chamber includes injecting said reaction material into said reaction chamber along a path which intersects said first location and controlling the generation of said plurality of radiation beams such that they all intersect said reaction material at said first location substantially simultaneously and wherein the multiple shock waves generated cooperatively heat and compress the reaction material intersected thereby to effect conversion of said reaction material to said second crystalline structure.

6. A method in accordance with claim 1 wherein said first quantity of said reaction material is disposed at said first location in an open cavity of a solid member.

7. A method in accordance with claim 1 wherein said reaction material contains a quantity of carbon and the intensity of the radiant energy of said radiant energy beam directed against said first reaction material is sufficient to convert at least a portion of said carbon to a hard crystalline structure having the characteristics of diamond.

8. A method in accordance with claim 1 wherein said quantity of said first reaction material is disposed at said first location against a surface of a solid material and is converted to said second solid state thereagainst.

9. A method in accordance with claim 8 which includes bonding said material disposed against said surface to said solid material by means of the radiant energy of said beam transferred thereto.

10. A method of converting carbon to diamond comprising:
    disposing a quantity of carbon in a cavity formed in a surface of a die, and
    generating and directing an intense radiation beam along an axis intersecting said carbon disposed in said die cavity so as to cause the radiation of said beam to intensely heat said carbon and to generate at least one shock wave therein to convert at least a portion of the carbon in said die to diamond.

11. A method in accordance with claim 10 which includes bonding the diamond formed in said die cavity to the walls of the die cavity as it is formed therein.

12. A method of converting carbon to a hard diamond-like structure comprising:
    disposing a quantity of carbon against a surface of a solid substrate, and
    generating and directing intense radiation to intersect said carbon on said substrate and to heat and react on same in a manner to convert at least a portion of said carbon to a hard diamond-like structure against said substrate.

13. A method in accordance with claim 12 which includes bonding said hard diamond-like structure to said surface of said substrate as it is formed thereon.

14. A method of forming a composite article with a hard wear resistant surface portion comprising:
    disposing a select quantity of a material containing carbon against a select portion of a surface of a solid substrate,
    generating and directing intense beamed radiation towards said substrate to cause said intense radiation to intersect said carbon containing material while it is disposed against said substrate, and
    intensely heating said carbon containing material against said substrate with said radiation while simultaneously generating and directing a shock wave through said material in a manner to effect the conversion of at least a portion of the carbon thereof to a hard diamond-like material, and forming a composite article of said substrate and at least a portion of said carbon containing material.

15. A method in accordance with claim 14 wherein said composite article is formed by bonding said hard diamond-like material to said select portion of the surface of said solid substrate.

16. A method in accordance with claim 14 wherein said substrate is a die having a die cavity, said method including disposing at least a portion of said carbon containing material in said die cavity, forming said hard diamond-like material within said die cavity and bonding same to the wall of said die cavity.

17. A method in accordance with claim 14 wherein said substrate is a die containing an operating surface portion, said method including disposing said carbon containing material against said operating surface portion and simultaneously forming said hard diamond-like material from carbon thereof and bonding said diamond-like material to said operating surface portion of said die.

18. A method of forming a composite article having a hard wear-resistant surface portion comprising:

disposing a carbon containing material against a surface of an article defined by a solid substrate and adapted to form part of a composite article, generating and directing intense radiation against said carbon containing material disposed against the surface of said article, and heating said carbon containing material and said substrate with said intense radiation while said carbon containing material is disposed adjacent said surface of said article in a manner to effect the conversion of at least a portion of said carbon containing material to a hard diamond-like material while it is disposed against the surface of said article so as to form a hard stratum of said diamond-like material on said surface, and bonding said diamond-like material to the surface of said substrate to form a composite article of said substrate and said diamond-like material wherein said diamond-like material forms at least a portion of the surface of said composite article.

* * * * *